(12) United States Patent
Ma et al.

(10) Patent No.: US 10,999,928 B1
(45) Date of Patent: May 4, 2021

(54) CIRCUIT BOARD

(71) Applicant: CHIPBOND TECHNOLOGY CORPORATION, Hsinchu (TW)

(72) Inventors: Yu-Chen Ma, Kaohsiung (TW); Hsin-Hao Huang, Kaohsiung (TW); Wen-Fu Chou, Kaohsiung (TW); Gwo-Shyan Sheu, Kaohsiung (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 16/914,844

(22) Filed: Jun. 29, 2020

(30) Foreign Application Priority Data

Dec. 31, 2019 (TW) .................................. 108148759

(51) Int. Cl.
*H05K 1/11* (2006.01)
*H05K 1/18* (2006.01)
*H05K 1/03* (2006.01)

(52) U.S. Cl.
CPC .............. *H05K 1/111* (2013.01); *H05K 1/18* (2013.01); *H05K 1/0393* (2013.01); *H05K 1/118* (2013.01); *H05K 1/189* (2013.01); *H05K 2201/09227* (2013.01)

(58) Field of Classification Search
CPC .......... H05K 1/111; H05K 1/18; H05K 1/118; H05K 1/189; H05K 1/0393; H05K 2201/09227
See application file for complete search history.

(56) References Cited

U.S. PATENT DOCUMENTS

| | | | | |
|---|---|---|---|---|
| 6,559,524 B2* | 5/2003 | Seko | ...................... | H01L 21/563 174/259 |
| 7,732,933 B2* | 6/2010 | Chung | ................. | H01L 23/4985 257/779 |
| 10,211,142 B1* | 2/2019 | Chen | .................. | H01L 23/49838 |
| 2008/0203563 A1* | 8/2008 | Takahashi | ............. | H01L 23/544 257/737 |
| 2015/0311148 A1* | 10/2015 | Jung | .................. | H01L 23/49838 361/767 |

* cited by examiner

*Primary Examiner* — Ishwarbhai B Patel
(74) *Attorney, Agent, or Firm* — Demian K. Jackson; Jackson IPG PLLC

(57) ABSTRACT

A circuit board electrically connected to a chip includes a substrate and a circuit layer. A first conductive line of the circuit layer includes a main line and a branch lead connected with each other. The branch lead provided to increase lead quantity for bonding with the chip includes an extension part and a bonding part which is used for bonding a bump of the chip. During thermal compression, gaps existing between the extension part and the main line and between the bonding part and the main line can prevent solder on the main line from flowing toward the bump and overflowing from the branch lead.

13 Claims, 6 Drawing Sheets

CIRCUIT BOARD

FIELD OF THE INVENTION

This invention relates to a circuit board, and more particularly to a circuit board having a main line and at least one branch lead on a chip mounting area.

BACKGROUND OF THE INVENTION

As shown in FIG. 1, thermal compression is a conventional flip-chip bonding technology to bond bumps 21 of a chip (not shown) to inner leads 12 on a chip mounting area 11 of a substrate 10. The quantity of the bumps 21 used to electrically connect with the inner leads 12 is increased with increasing functions of the chip, and solder short between the adjacent bumps is likely to happen if the chip mounting area is reduced or not changed.

SUMMARY

One object of the present invention is to provide a circuit board having inner leads, a main line and at least one branch lead on a chip mounting area of a substrate, the branch lead is provided for bonding a bump.

A circuit board of the present invention includes a substrate and a circuit layer. A layout area and a chip mounting area are defined on the substrate, and the circuit layer includes at least one first conductive line and a plurality of second conductive lines. The at least one first conductive line is disposed on the chip mounting area, each of the second conductive lines includes an inner lead and a base line connected with each other. The inner lead having a first width is disposed on the chip mounting area and located between the at least one first conductive line and an edge of the chip mounting area along a direction of a vertical axis, the base line is disposed on the layout area. The at least one first conductive line includes a main line and at least one branch lead, the main line extends along a direction of a first axis intersecting with the vertical axis and has a second width higher than or equal to the first width, the at least one branch lead includes a bonding part, a connection part and an extension part which is located between the bonding part and the connection part. The bonding part is provided for bonding a bump of a chip, the connection part is connected to the main line along a direction of a second axis intersecting with the vertical axis and has a third width lower than the second width. A first gap exists between the extension part and the main line, a second gap exists between the bonding part and the main line, and a free end of the bonding part is not connected to the main line.

The branch lead disposed on the chip mounting area is provided for electrical connection with the bump, as a result, the circuit board has a higher quantity of leads for bonding with the chip, and solder short between the adjacent bumps is prevented even while the chip mounting area is reduced or not changed.

Solder on the first conductive line is heated and flows toward the bump along the main line during thermal compression, however, solder overflow around the extension part or the bonding part bonding with the bump is inhibited due to (1) the connection part narrower than the main line, (2) the first gap between the extension part and the main line, (3) the second gap between the bonding part and the main line, and (4) the free end of the bonding part not connected to the main line.

DETAILED DESCRIPTION OF THE INVENTION

Figure 1:
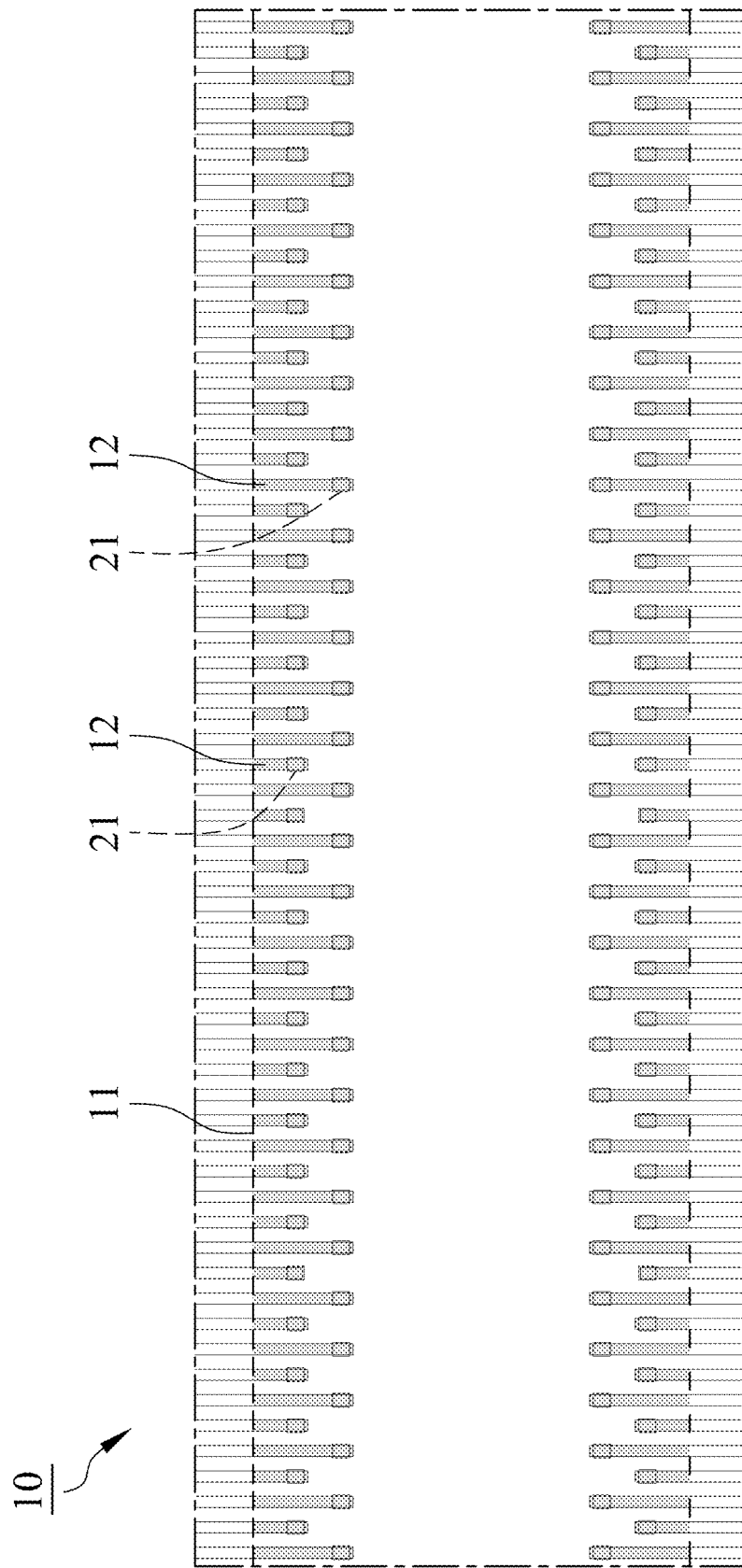
FIG. 1 is a partial schematic diagram illustrating a conventional circuit board.
Figure 2:
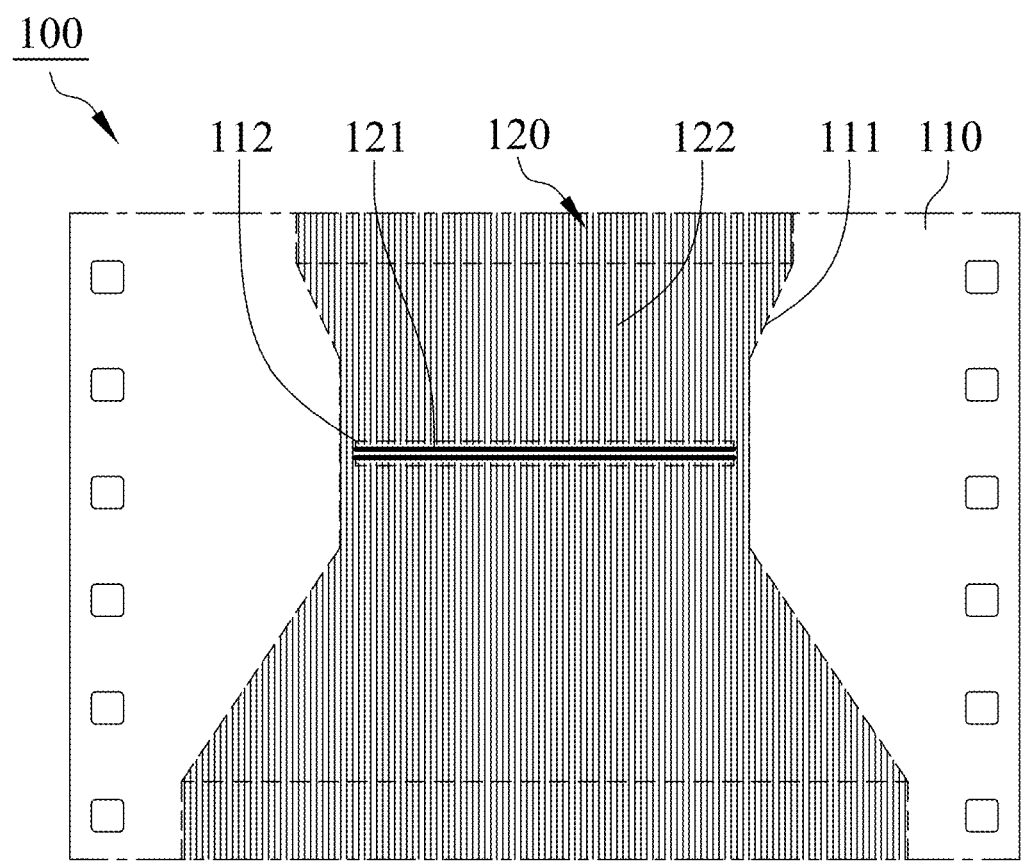
FIG. 2 is a schematic diagram illustrating a circuit board in accordance with a first embodiment of the present invention.
Figure 3:
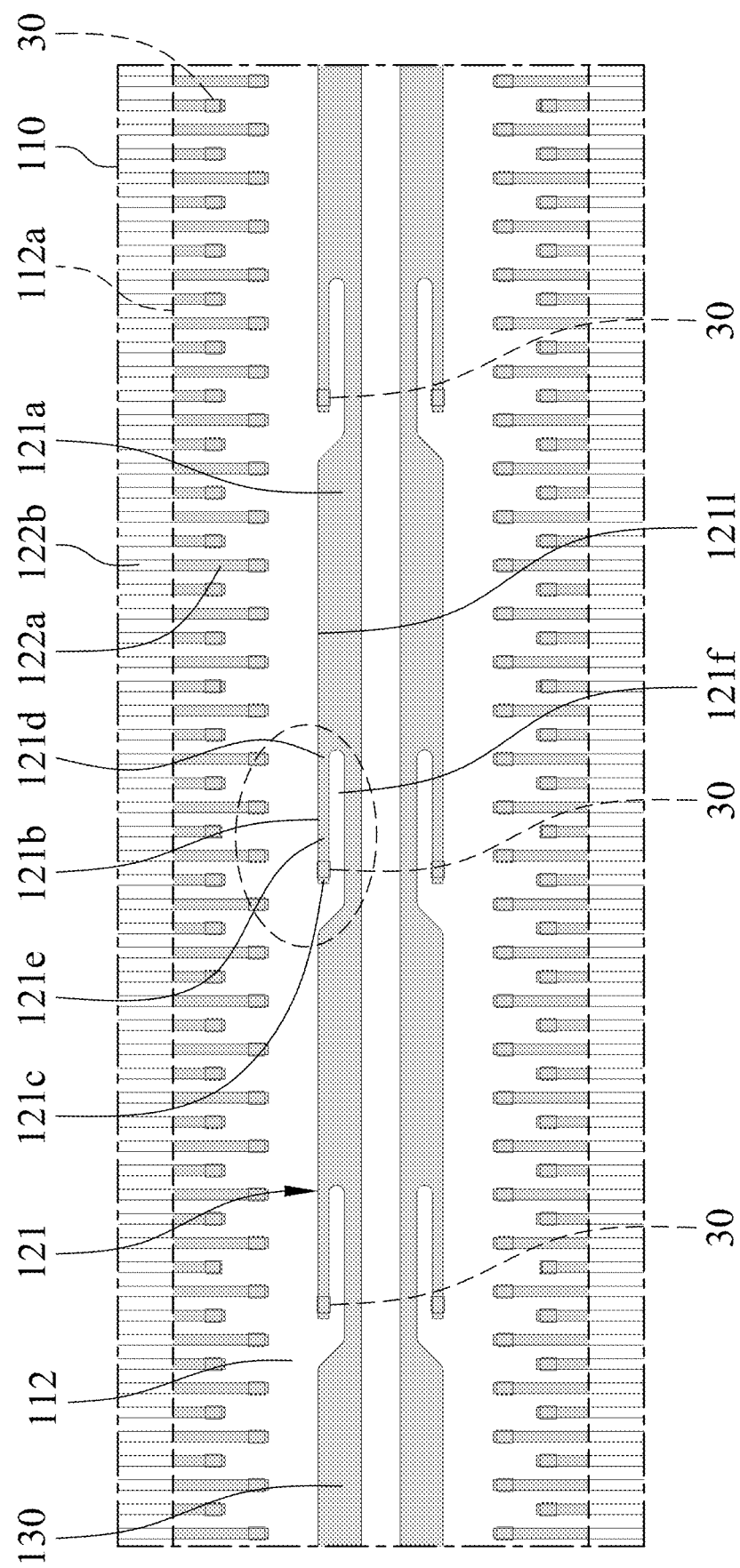
FIG. 3 is a partial schematic diagram illustrating the circuit board in accordance with the first embodiment of the present invention.
Figure 4:
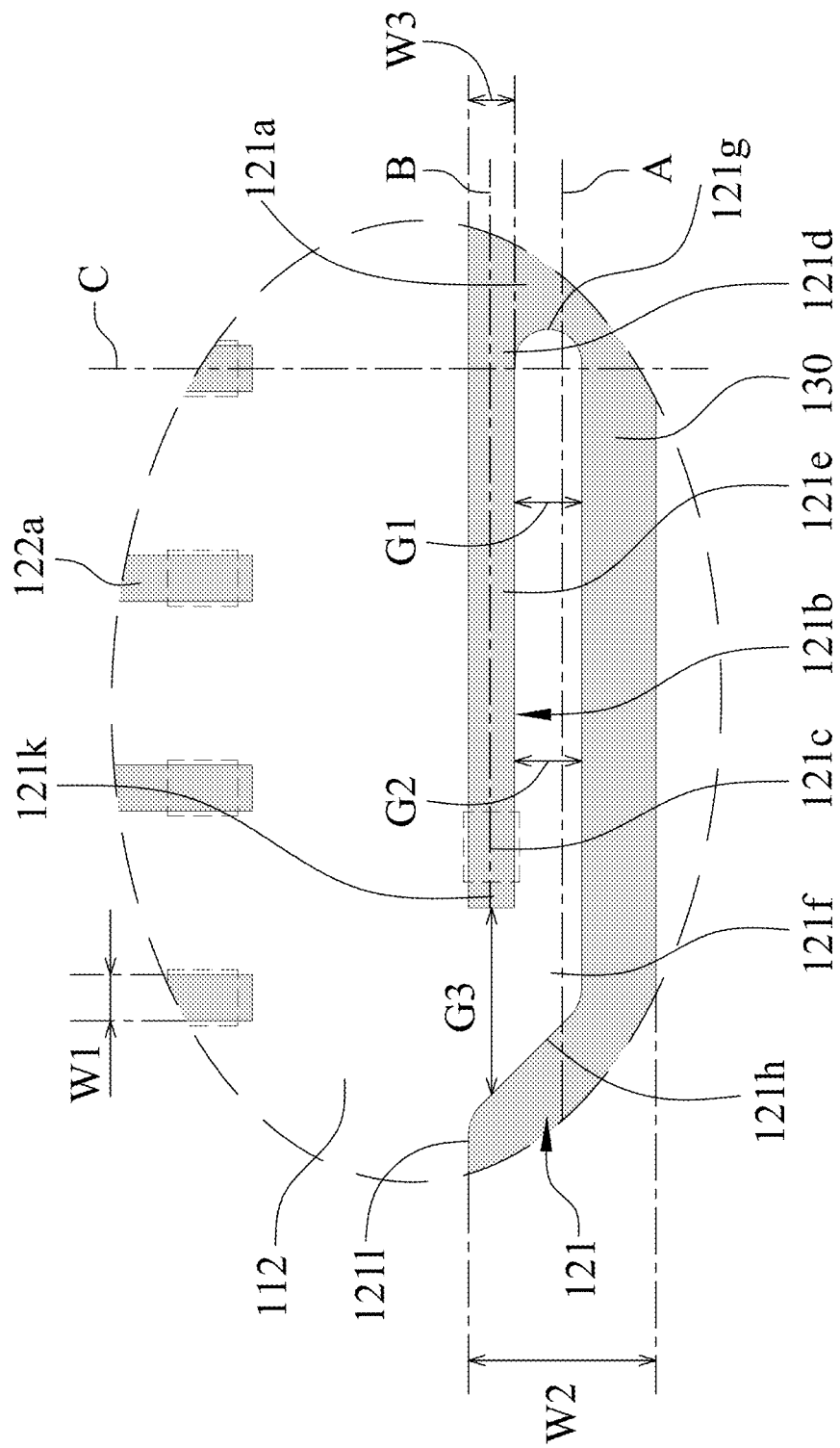
FIG. 4 is a partial enlarged diagram of FIG. 3.

With reference to FIGS. 2, 3 and 4, a circuit board 100 in accordance with a first embodiment of the present invention includes a substrate 110 and a circuit layer 120, preferably, the circuit board 100 further includes a solder layer 130 that covers the circuit layer 120 and has a thickness lower than or equal to 0.3 μm. As shown in FIG. 2, a layout area 111 and a chip mounting area 112 are defined on the substrate 110, the chip mounting area 112 is provided for mounting of a chip (not shown) and corresponding to a bump forming area on the chip. Generally, there are a plurality of bumps 30 disposed on the bump forming area.

With reference to FIGS. 2, 3 and 4, the circuit layer 120 includes at least one first conductive line 121 and a plurality of second conductive lines 122. Each of the second conductive lines 122 includes an inner lead 122a and a base line 122b connected with each other. The base line 122b is disposed on the layout area 111, and the inner lead 122a having a first width W1 is disposed on the chip mounting area 112 along a direction of a vertical axis C.

With reference to FIGS. 2, 3 and 4, the first conductive line 121 is disposed on the chip mounting area 112, and the inner leads 122a are located between the first conductive line 121 and an edge 112a of the chip mounting area 112 along the direction of the vertical axis C. Preferably, the solder layer 130 covers the first conductive line 121 and the inner leads 122a of the second conductive lines 122. The first conductive line 121 includes a main line 121a and at least one branch lead 121b which are connected to one another. The main line 121a extends along a direction of a first axis A intersecting with the vertical axis C and has a second width W2 higher than or equal to the first width W1. The branch lead 121b includes a bonding part 121c, a connection part 121d and an extension part 121e, the extension part 121e is located between the bonding part 121c and the connection part 121d. The bonding part 121c is provided for bonding the bump 30 of the chip, the connection part 121d is connected to the main line 121a along a direction of a second axis B intersecting with the vertical axis C and has a third width W3 lower than the second width W2. A first gap G1 exists between the extension part 121e and the mainline 121a, a second gap G2 exists between the bonding part 121c and the main line 121a, and the bonding part 121c has a free end 121k not connected to the main line 121a. With reference to FIGS. 3 and 4, in the first embodiment, the directions of the first axis A and the second axis B are the same. Preferably, the extension part 121e extends along the direction of the first axis A, and more preferably, the bonding part 121c also extends along the direction of the first axis A such that another first conductive line 121 can be disposed on the chip mounting area 112 to allow the circuit board 100 to bond with more bumps.

With reference to FIGS. 2 and 3, the branch lead 121*b* located on the chip mounting area 112 is provided for bonding with the bump 30 so as to increase lead quantity of the circuit board 100 for bonding with the chip.

With reference to FIGS. 3 and 4, in the first embodiment, a notch 121*f* having a first side wall 121*g* and a second side wall 121*h* is recessed on an edge 1211 of the main line 121*a*. The connection part 121*d* is connected to the first side wall 121*g*, and in the first embodiment, the connection part 121*d*, the extension part 121*e* and the bonding part 121*c* are all located inside the notch 121*f*, and a third gap G3 exists between the bonding part 121*c* and the second side wall 121*h*. However, according to different design requirements, at least one of the connection part 121*d*, the extension part 121*e* and the bonding part 121*c* may be not located inside the notch 121*f* in other embodiments.

With reference to FIGS. 2, 3 and 4, although the solder layer 130 on the first conductive line 121 is heated to be softened and flows toward the bump 30 along the main line 121*a* during thermal compression, solder overflow around the extension part 121*e* or the bonding part 121*c* bonding with the bump 30 is prevented owing to (1) the third width W3 of the connection part 121*d* is lower than the second width W2 of the main line 121*a*, (2) the first gap G1 exists between the extension part 121*e* and the main line 121*a*, (3) the second gap G2 exists between the bonding part 121*c* and the main line 121*a* and (4) the free end 121*k* of the bonding part 121*c* is not connected to the main line 121*a*.

Figure 5:
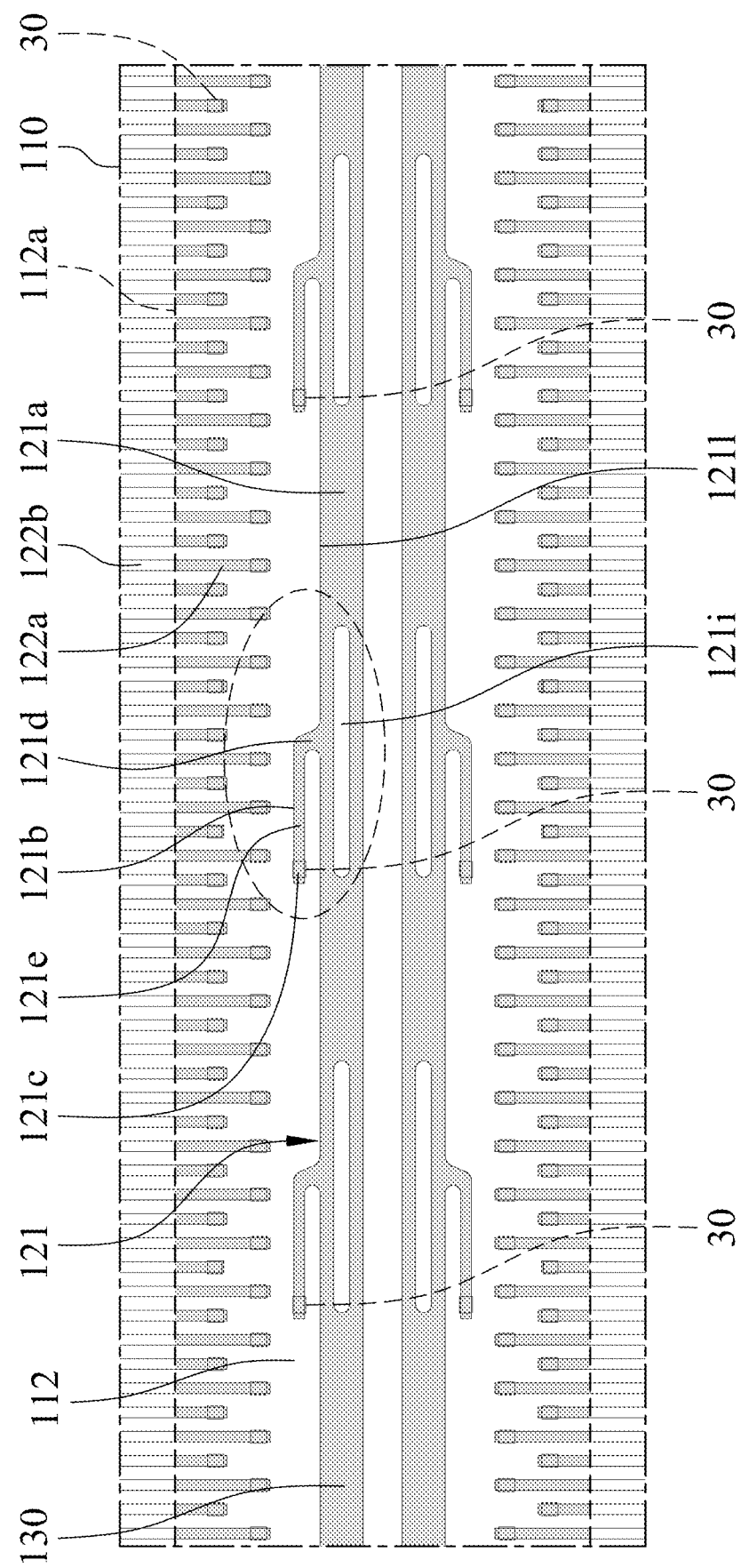
FIG. 5 is a partial schematic diagram illustrating a circuit board in accordance with a second embodiment of the present invention.
Figure 6:
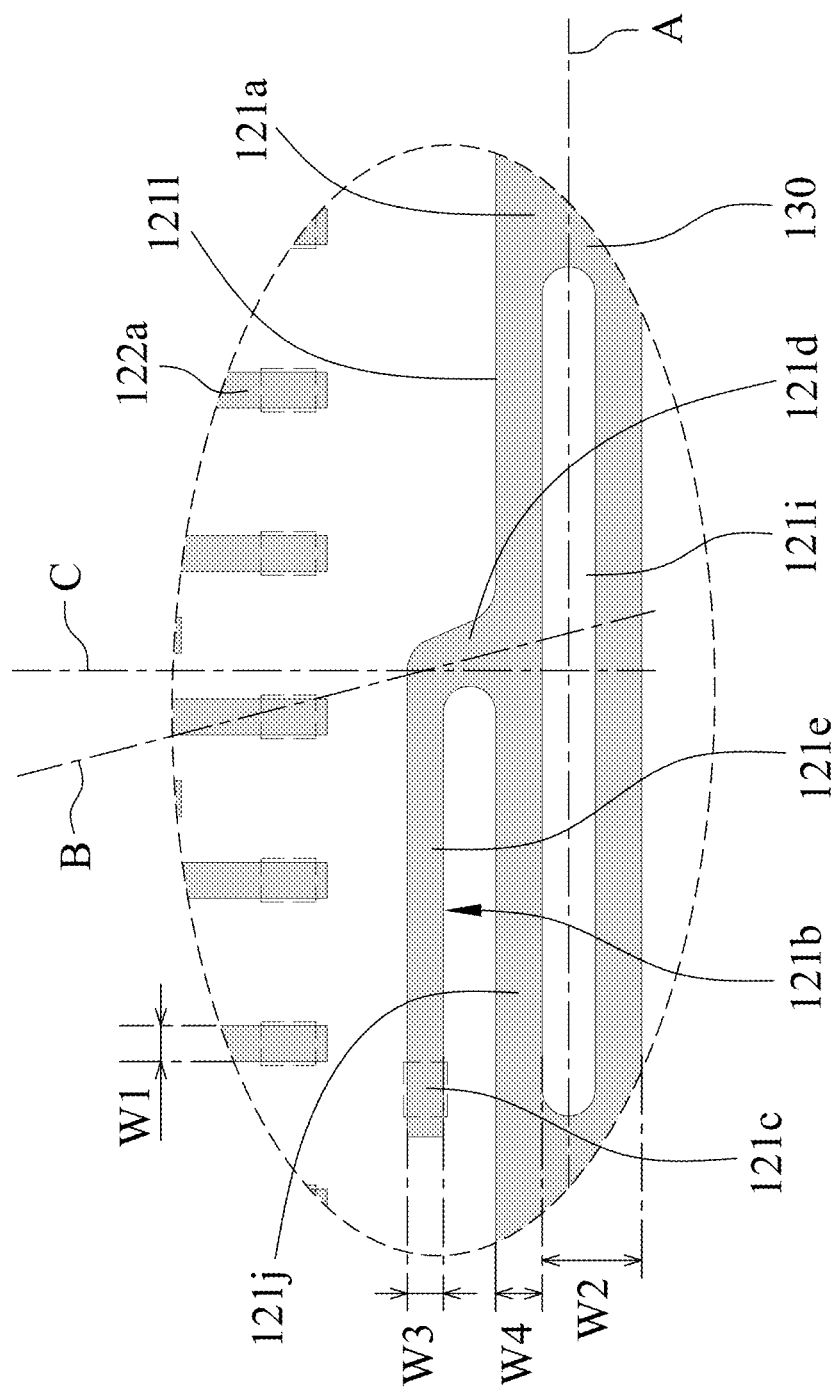
FIG. 6 is a partial enlarged diagram of FIG. 5.

FIGS. 5 and 6 show a second embodiment of the present invention, and the difference between the first and second embodiments is the direction of the second axis B. In the second embodiment, the first axis A and the second axis B are intersected. Along the direction of the second axis B, the connection part 121*d* is connected to the edge 1211 of the main line 121*a*, the extension part 121*e* and the bonding part 121*c* are located outside the main line 121*a*. Further, the main line 121*a* has at least one through hole 121*i* so as to form a sub-line 121*j* at a side of the through hole 121*i* in the second embodiment. The sun-line 121*j* is located between the connection part 121*d* and the through hole 121*i* and is connected to the connection part 121*d*. The sub-line 121*j* has a fourth width W4 lower than the second width W2.

With reference to FIGS. 5 and 6, during thermal compression, the solder layer 130 on the main line 121*a* is heated to be softened and flows toward the bump 30 along the sub-line 121*j* and the branch lead 121*b*, but solder overflow around the extension part 121*e* or the bonding part 121*c* bonding with the bump 30 is avoidable because the connection part 121*d* is narrower than the sub-line 121*j* in width.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A circuit board, comprising:
a substrate, a layout area and a chip mounting area are defined on the substrate; and
a circuit layer including at least one first conductive line and a plurality of second conductive lines, the at least one first conductive line is disposed on the chip mounting area, each of the second conductive lines includes an inner lead and a base line connected with each other, the inner lead having a first width is disposed on the chip mounting area and located between the at least one first conductive line and an edge of the chip mounting area along a direction of a vertical axis, the base line is disposed on the layout area, the at least one first conductive line includes a main line and at least one branch lead, the main line extends along a direction of a first axis intersected with the vertical axis and has a second width higher than or equal to the first width, the at least one branch lead includes a bonding part, a connection part and an extension part which is located between the bonding part and the connection part, the bonding part is provided for bonding a bump of a chip, the connection part is connected to the main line along a direction of a second axis intersected with the vertical axis and has a third width lower than the second width, a first gap exists between the extension part and the main line, a second gap exists between the bonding part and the main line, and a free end of the bonding part is not connected to the main line.

2. The circuit board in accordance with claim 1, wherein the directions of the first and second axes are the same.

3. The circuit board in accordance with claim 1, wherein the extension part extends along the direction of the first axis.

4. The circuit board in accordance with claim 3, wherein the bonding part extends along the direction of the first axis.

5. The circuit board in accordance with claim 3, wherein a notch is recessed on an edge of the main line and has a first side wall and a second side wall, the connection part is connected to the first side wall.

6. The circuit board in accordance with claim 5, wherein the extension part is located in the notch.

7. The circuit board in accordance with claim 5, wherein the bonding part is located in the notch and a third gap exists between the bonding part and the second side wall.

8. The circuit board in accordance with claim 1, wherein a notch is recessed on an edge of the main line and has a first side wall and a second side wall, the connection part is connected to the first side wall.

9. The circuit board in accordance with claim 8, wherein the extension part is located in the notch.

10. The circuit board in accordance with claim 8, wherein the bonding part is located in the notch and a third gap exists between the bonding part and the second side wall.

11. The circuit board in accordance with claim 1, wherein the first and second axes are intersected, the connection part is connected to an edge of the main line along the direction of the second axis, the extension part and the bonding part are located outside the main line.

12. The circuit board in accordance with claim 11, wherein the main line includes at least one through hole and a sub-line, the sub-line is located between the connection part and the at least one through hole, and the connection part is connected to the sub-line.

13. The circuit board in accordance with claim 1 further comprising a solder layer, wherein the solder layer covers the at least one first conductive line and has a thickness lower than or equal to 0.3 µm.

* * * * *